United States Patent [19]

Vollenbroek et al.

[11] Patent Number: 4,704,347
[45] Date of Patent: Nov. 3, 1987

[54] METHOD OF MANUFACTURING A SEMICONDUCTOR DEVICE, IN WHICH A PHOTOLACQUER MASK IS FORMED BY MEANS OF A TWO-LAYER LACQUER SYSTEM.

[75] Inventors: Franciscus A. Vollenbroek, Eindhoven; Jan G. Dil, Almelo; Henricus J. J. Kroon, Eindhoven; Elisabeth J. Spiertz, Eindhoven; Wilhelmus P. M. Nijssen, Eindhoven, all of Netherlands

[73] Assignee: U.S. Philips Corporation, New York, N.Y.

[21] Appl. No.: 823,864

[22] Filed: Jan. 29, 1986

[30] Foreign Application Priority Data

Feb. 18, 1985 [NL] Netherlands .......................... 8500455

[51] Int. Cl.$^4$ ............................................. G03C 5/00
[52] U.S. Cl. .................................... 430/312; 430/156; 430/273; 430/292; 430/330; 430/394
[58] Field of Search ............... 430/156, 312, 394, 328, 430/273, 292, 293, 503, 330

[56] References Cited

U.S. PATENT DOCUMENTS 4,251,619 2/1981 Kurita .................................. 430/292
4,362,809 12/1982 Chen et al. ......................... 430/312
4,555,471 11/1985 Barzynski et al. .................. 430/273

Primary Examiner—John E. Kittle
Assistant Examiner—José G. Dees
Attorney, Agent, or Firm—Norman N. Spain

[57] ABSTRACT

A method of manufacturing a semiconductor device, in which there is applied to a surface of a semiconductor substrate a base layer of photosensitive lacquer, which is coated with a top layer of photosensitive lacquer. By means of a first patterned irradiation, there is formed in the top layer a mask of which a contact copy is formed in the base layer during a second irradiation. A material which can be discolored is used for the top layer. During the first irradiation, the top layer is locally discolored, whereupon the layer thus discolored is used as a mask during the second irradiation. By the use of the discoloring top layer, additional processing steps, which would ensure from a wet development of the top layer, are avoided.

7 Claims, 9 Drawing Figures

METHOD OF MANUFACTURING A SEMICONDUCTOR DEVICE, IN WHICH A PHOTOLACQUER MASK IS FORMED BY MEANS OF A TWO-LAYER LACQUER SYSTEM.

BACKGROUND OF THE INVENTION

The invention relates to a method of manufacturing a semiconductor device, in which a base layer of photosensitive lacquer is applied to a surface of a semiconductor substrate, this layer being coated with a top layer of photosensitive lacquer, in which, by means of a patterned irradiation a mask is formed, which mask is used during a second irradiation as masking for a patterned irradiation of the base layer.

Such a method is more particularly suitable for the manufacture of semiconductor devices having a semiconductor substrate whose surface is not planar. In the manner described above, very narrow lacquer profiles having very steep edges can be formed in the base layer of a two-layer lacquer system comprising a base layer and a top layer. With the use of such a lacquer mask, it is possible, for example, to etch a a layer of a conductive material present on a non-planar surface to form conductive tracks whose width and separation are smaller than 1 $\mu$m.

U.S. Pat. No. 4,362,809 discloses a method of the kind mentioned in the opening paragraph, in which a known photolacquer sensitive to radiation having wavelengths of 300 to 500 nm is used for the top layer and a layer of polymethylmethacrylate (PMMA) sensitive to radiation having wavelengths of 200 to 300 nm is used at the bad layer. After the first patterned irradiation in a so-called projection printer—in which a photolacquer mask is projected onto the top layer—, the top layer is developed in a usual developer. The mask thus formed in the top layer then consists of lacquer tracks located on the base layer, between which open spaces are present. The second irradiation is carried out by means of substantially parallel directed ultraviolet radiation having wavelengths of 200 to 300 nm, which is absorbed by the material of the top layer. Thus, a contact copy is formed in the base layer from the mask formed in the top layer.

By means of the known method described, lacquer tracks, whose width and separation are smaller than 1 $\mu$m, can be formed in the base layer. However, this method has the disadvantage that a developing treatment in a wet developer is required for the conversion of the picture formed in the top layer by the first irradiation into a mask. This leads to additional processing steps because during the second irradiation the semiconductor substrate should be dry and clean again.

BRIEF SUMMARY OF THE INVENTION

The invention has for its object to avoid these additional processing steps resulting on a wet development at the top layer.

According to the invention, for this purpose the method of the kind mentioned in the opening paragraph is characterized in that the top layer comprises a material that can be discolored by radiation and in that the top layer is locally discolored by the first patterned irradiation, whereupon the locally discolored top layer is used as a mask during the second irradiation. A material that can be discoloured under the influence of radiation is to be understood herein to mean a material which has an absorption spectrum which can vary under the influence of radiation. These variations need not take place in a wavelength range within/which the radiation causing the discoloring is also present. For example, a visible discoloring may be obtained by electron or X-ray radiation. The said variation of the absorption spectrum may be, for example, an increase or a decrease and also a shift of an absorption maximum.

When according to the invention the discolored top layer is directly used as a mask, an additional processing step for converting the picture formed by radiation into a mask is avoided. Furthermore, additional processing steps are avoided, which could be required to render the substrate suitable again for the second irradiation after the mask has been formed.

DETAILED DESCRIPTION OF THE INVENTION

Figure 1:
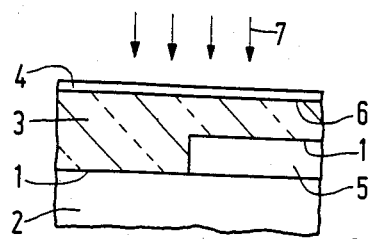
FIGS. 1 to 4 are diagrammatic sectional views showing successive stages of a semiconductor device during manufacture by means of the method of the invention.

A preferred embodiment of the method according to the invention is characterized in that a material is used for the top layer which during the first patterned irradiation is discolored in a wavelength range between 300 and 500 nm. Since the color variation occurs in a wavelength range between 300 and 500 nm, the second irradiation can be effected with radiation from this wavelength range. The material for the base layer can then be a usual photolacquer containing novolak. Such a photolacquer is sensitive to radiation having wavelengths between 300 and 500 nm. The use of a photolacquer composed on the basis of novolak has the advantage that the lacquer tracks formed therein have a considerably higher resistance to etching plasmas than PMMA tracks.

Another preferred embodiment of the method according to the invention is characterized in that for the top layer a material is used which can be discolored by radiation having a wavelength between 300 and 400 nm. Since the top layer can be discolored under the influence of radiation having a wavelength between 300 and 400 nm, a conventional projection device can be used for carrying out the first irradiation.

A further preferred embodiment of the method according to the invention is characterized in that during the first irradiation non-irradiated parts are made insensitive to radiation before the second irradiation is carried out. Thus, it is achieved that during the second irradiation radiation can also be used having wavelengths by which the part of the top layer not exposed during the first irradiation would have been discoloured and the mask formed in the top layer would changed during the second irradiation. Which would as a result of have a contact copy of lower quality in the base layer would have been formed.

A method of the invention in which the step of rendering the non-irradiated polyinsensitive to radiation can be effected in a simple manner, is characterized in that the material of the top layer comprises two constituents, one of which produces under the influence of the first patterned irradiation a substance which can react with the second constituent to form a compound which has a color different from that of the second constituent. The step of rendering the non-irradiated parts in the top layer insensitive to radiation can be effected by removing either the first constituent or the second constituent after the first patterned irradiation. As will appear below, this can be readily carried out by means of a simple heat treatment.

A very practical method according to the invention is characterized in that the first constituent is tetrabromomethane or a halogen-containing triazin derivative, in that the second constituent is an imine corresponding to the formula

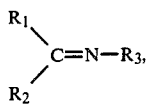

where $R_1$ is parasubstituted aminophenyl, $R_2$ is hydrogen, alkyl or substituted phenyl and $R_3$ is hydrogen, alkyl or substituted phenyl, and in that the two constituents are added to a solution of polystyrene in xylene. Due to the patterned irradiation—which in this case can be effected instead of with ultraviolet radiation having wavelengths of 300 to 450 nm also with X-ray or electron radiation—, there is formed from tetrabromomethane or from the halogen-containing triazin derivative an acid which can react with the imine. A compound is then formed which has a color different from that of the original imine. By the choice of $R_1$, $R_2$ and $R_3$, the original color and the discoloring of the top layer can be determined within wide limits.

Preferably, the first constituent is tetrabromomethane and $R_1$ in the second constituent is paradiethylaminophenyl, $R_2$ is hydrogen and $R_3$ is paramethylphenyl. The discoloring of the top layer then takes place within a wavelength range between 300 and 500 nm so that for the base layer a usual photolacquer can be employed containing a novolak.

During the first patterned irradiation, non-irradiated parts of the top layer can be made insensitive to radiation in a simple manner by a heat treatment, in which tetrabromomethane still left in the top layer is removed. Thus, during the second irradiation, acid can no longer be formed at these areas so that the imine present there will not be discolored either.

The invention will now be described more fully, by way of example, with reference to the drawings which is not to scale and a few embodiments.

FIGS. 1 to 4 of the drawing show diagrammatic sectional views of successive stages of the manufacture of a semiconductor device, in which a base layer 3 of photosensitive lacquer is applied to a surface 1 of a semiconductor substrate 2, which base layer is coated with a top layer 4 of photosensitive lacquer. In practical cases, the surface 1 will not be planar, but will have unevennesses. Such an unevenness is shown here diagrammatically by an embossed part 5. The base layer is applied in usual manner by spinning and will then have a substantially planar surface 6. This means that in practical cases the base layer 3 may have comparatively large differences in thickness. The top layer 4 is also applied in usual manner by spinning. The latter is formed on the substantially planar surface 6 and will therefore have a substantially uniform thickness throughout its areas.

By means of a first patterned radiation—indicated diagrammatically by arrows 7—, a mask 8 is formed in the top layer 4. During a second irradiation—indicated diagrammatically by arrows 9—, the mask 8 is used as masking for a patterned irradiation of the base layer 3. The first patterned irradiation 7 is carried out in a conventional projection device, in which a photomask is projected onto the top layer 4. Since the top layer 4 is planar and thin, the mask formed therein in this manner will have comparatively abrupt transitions 10 between irradiated parts and non-irradiated parts. The second irradiation is carried out in a usual manner with a parallel directed radiation 9. Thus, a contact copy is formed from the mask 8 in the base layer 3, a part 11 of the base layer being exposed.

The top layer 4 is now removed, whereupon the base layer 3 is developed in a usual manner. Thus, a lacquer pattern 12 is formed in the base layer and this pattern will have edges having a steepness as can be realized in forming contact copies. With the use of the two-layer lacquer system 3, 4 described, it is possible, for example, to etch into a non-planar surface 1 grooves whose width and (spacing) are smaller than 1 μm.

According to the invention, for the top layer 4 a material is used which can be discoloured by radiation. This means that for the top layer a material is used which has a radiation absorption spectrum which varies under the influence of radiation. These variations need not take place in a wavelength range within which the discoloring radiation is also present. Thus, for example, a visible discoloring may be caused by an electron or X-ray irradiation. The variation of absorption spectrum may be, for example, an increase or a decrease, but also a shift of an absorption maximum.

In the method according to the invention, the top layer is locally discolored by the patterned irradiation 7, whereupon the locally discolored top layer 4 is used as a mask during the second irradiation 9. Since the discolored top layer 4 is directly used as a mask, additional processing steps connected with a usual development of usual photolacquer are avoided. It will otherwise appear below that the use of a discolorable material for the top layer has many other advantages in the manufacture of semiconductor devices.

Preferably, a material is used for the top layer 4 whose color changes in a wavelength range between 300 and 500 nm during the first patterned irradiation 7. In this case, the second irradiation can be carried out with radiation having wavelengths in this wavelength range. This means that usual photolacquers composed on the basis of novolak can be employed for the base layer 3 because these lacquers are sensitive in this wavelength range. Lacquer tracks formed in photolacquer composed on the basis of novolak are comparatively highly resistant to usual plasmas for etching semiconductor device materials, such as silicon, silicon oxide and silicon nitride.

It is further practically very efficacious that for the top layer 4 a material is used which can be discolored by radiation having a wavelength between 300 and 450 nm. In this case, for carrying out the first patterned irradiation 7 a conventional projection device can be used.

The parts of the top layer 4 not irradiated during the first irradiation are made insensitive to radiation before the second irradiation 9 is carried out. Thus, it is achieved that during the second irradiation radiation can also be used having having wavelengths which would have led to discoloring of the part not exposed during the first irradiation 7.

According to this embodiment the material of the top layer 4 comprises two constituents. A first constituent produces under the influence of the patterned irradiation 7 a substance that can react with the second constituent. During this reaction a compound is formed which has a color different from that of the second constituent itself. During the first patterned irradiation, non-irradiated parts of the top layer 4 can be made insensitive to radiation in a simple manner by removing either the first or the second constituent. This may be mostly effected by means of a simple heat treatment.

Referably to this aspect of the invention, the first constituent is tetrabromomethane or a halogen-containing triazin derivative and the second constituent is an imine corresponding to the formula:

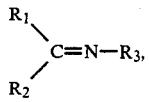

where $R_1$ is parasubstituted aminophenyl and $R_2$ is hydrogen, alkyl or substituted phenyl, while $R_3$ is hydrogen, alkyl or substituted phenyl. These two constituents are added to a solution of polystyrene in xylene. Due to the patterned irradiation 7—which can be carried out instead of with ultravoilet radiation having wavelengths between 300 and 450 nm also with an electron or X-ray radiation—, there is formed from tetrabromomethane or from the triazin derivative an acid which can react with the imine. A compound is then formed having a color different from that of the original imine. By the choice of $R_1$, $R_2$ and $R_3$, the original color and the discoloring of the top layer can be determined within wide limits.

Figure 5:
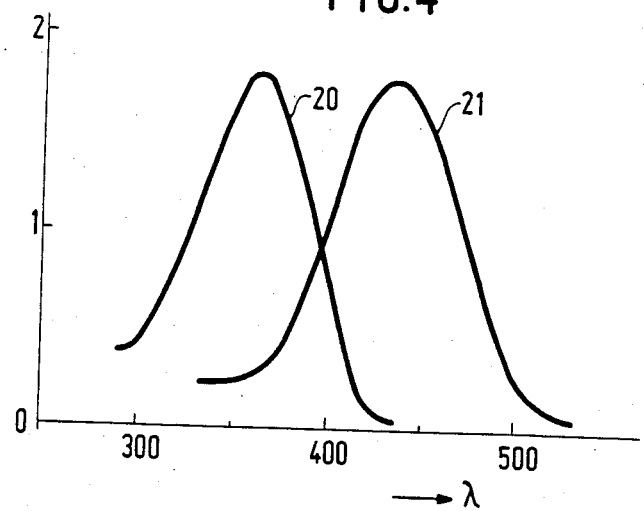
FIG. 5 is a graph showing the variations of the radiation absorption of a disposable material in the top layer, very suitable for use in the top layer as a function of wavelength before and after exposure to a disclosing radiation.

In FIG. 5, the curve 20 indicates the variation of the radiation absorption of an imine, in which $R_1$ is paradiethyl aminophenyl, $R_2$ is hydrogen and $R_3$ is paramethylphenyl. After discoloring, the radiation absorption has a variation as indicated by the curve 21. The discoloring consequently occurs in one wavelength range within which the usual photolacquers composed on the basis of novolak are sensitive.

During the first irradiation, non-irradiated parts of the top layer 4 are made insensitive to radiation by a heat treatment, in which still remaining tetrabromomethane is baked out of the top layer. The imine will thus no longer be discolored during the second irradiation.

Due to the fact that the two constituents of the top layer are added to a solution of polystyrene in xylene, it is achieved that, when the top layer is applied to the base layer consisting of a usual photolacquer composed on the basis of novolak, a mixing of the two layers does not occur. Such a mixing could lead to an intermediate layer, which could adversely affect a satisfactory irradiation and development of the base layer.

In the embodiments to be described hereinafter, a semiconductor substrate 2—consisting of Si—was provided in a usual manner with an adhesive layer (photolacquer primer) and was then heated for about 30 minutes at 200° C. An about 1.3 μm thick layer of positive photolacquer—HPR 204 of Waycoat Company—was applied thereto by spinning in about 30 seconds at 3000 revolutions per minute. The base layer 3 thus applied was then heated for about 30 minutes at 90° C. in a furnace with forced air circulation. Subsequently, an about 0.5 μm thick top layer 4 was applied by spinning to the base layer 3 in the manner described above. The top layer 4 contained 5% of polystyrene, m.w. 100,000 10% of CBr 4 and 3% of imine

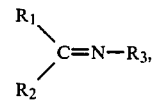

where $R_1$ was paradiethyl aminophenyl, $R_2$ was hydrogen and $R_3$ was paramethylphenyl dissolved in xylene.

The two layer lacquer system 3, 4 thus formed in all embodiments was subjected to a patterned irradiation (7) by means of a Perkin Elmer projection printer 1:1 of the type 120 with radiation having wavelengths between 350 and 450 nm, especially the wavelengths 365, 405 and 435 nm. The parts of the top layer not exposed during this irradiation were then made insensitive to radiation by a heat treatment of about 30 minutes at 75° C. in a furnace with a forced air circulation, during which unreacted $CBr_4$ is baked out of the layer. Thus a mask 8 is formed on the base layer 3 in the top layer, which mask had in the parts irradiated during the first irradiation 7 an absorption according to the curve 21 in FIG. 5 and had in the then not irradiated parts an absorption according to the curve 20 in FIG. 5. As a measure for the radiation absorption, the negative logarithm of the fraction of transmitted radiation is used in FIG. 5.

In the first embodiment (cf. the successive FIGS. 1, 2, 3, and 4), the second irradiation 9 was carried out with parallel directed ultraviolet radition from a source—an SP 500 W lamp of Philips Company and a Wood's 365 nm filter—, which emits radiation having wavelengths of 300 to 400 nm with a maximum emission at about 365 nm. Subsequently, the top layer 4 was removed by immersion in an ultrasonic xylene bath. Finally, the base layer 3 was developed in LSI developer of Hunt Company. Thus, a positive picture 12 having sharp edges 13 was formed in the base layer.

Figure 6:
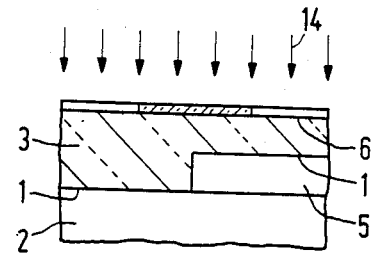
FIGS. 6 and 7 show diagrammatic sectional views of a semiconductor device during manufacture by means of a preferred embodiment of the method of the invention.
Figure 2:
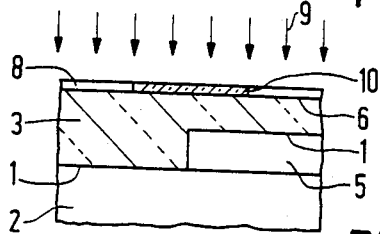
Figure 7:
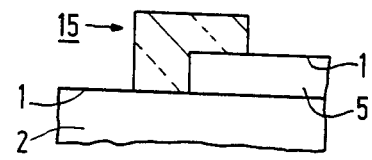
Figure 3:
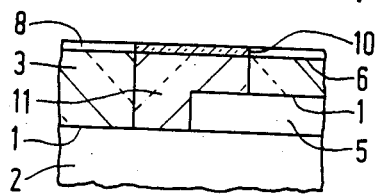

In the second embodiment—(cf. the successive FIGS. 1, 6 and 7), the second irradiation 14 was carried out with parallel directed ultraviolet radiation from a source—an SP 500 W lamp of Philips Company and a Scott GG 13 filter—, which emits radiation having wavelengths of 400 to 500 nm with a maximum emission at about 435 nm. In this embodiment, after the top layer 4 had been removed and the base layer 3 had been developed, a negative picture 15 was formed. The parts of the top layer 4 not irradiated during the first patterned irradiation 7 transmit the radiation during the second irradiation 14 and the parts of the base layer thus irradiated become developable and are removed during the development.

Figure 8:
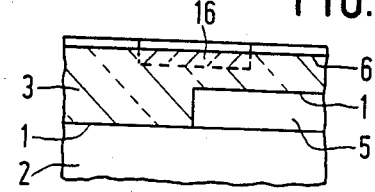
FIGS. 8 and 9 show diagrammatic sectional views of a semiconductor device during manufacture by means of an additional preferred embodiment of the method of the invention.
Figure 4:
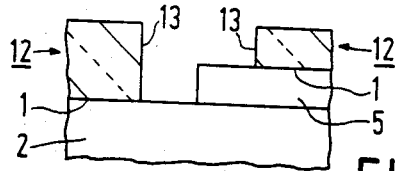
Figure 9:
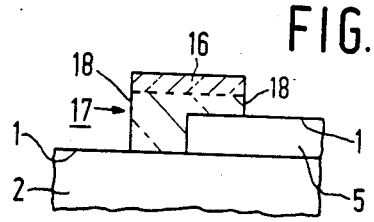

In a third embodiment (see the successive FIGS. 1, 6, 8 and 9), about 2% of a base—in this case imidazol—is added to the material of the base layer 3—HPR 204 of Waycoat Company. During the first patterned irradiation 7, via the top layer a surface part of the base layer 3 designated diagrammatically in FIG. 8 by reference numeral 16 is irradiated. In the surface part 16, indene carbonic acid is then formed, which reacts with the imidazol during a thermal treatment of about 30 minutes at 95° C.—during which CBr₄ is baked out of the top layer—, the indene carbonic acid being decarboxylated. The surface part 16 of the base layer thus becomes poorly soluble in developer. The negative picture 17 formed after the second irradiation 14 as in the second embodiment and after development has very steep edges 18.

In the fourth embodiment (see the successive FIGS. 1, 2, 3 and 4), the first patterned irradiation was carried out by an electron beam having a beam intensity of 10 $\mu C/cm^2$. Subsequently, the second irradiation was carried out as in the first embodiment. After the top layer 4 had been removed and the base layer had been developed, a positive picture 12 was obtained.

It will be appreciated that the invention is not limited to the embodiments described. Many variations are possible within the scope of the invention for those skilled in the art. For example, the top layer 4 may also be rendered insensitive to radiation by removing the second constituent in the top layer—the imine used in the embodiments—by means of a thermal treatment at about 100° C. The layer then becomes colorless at the areas not irradiated during the first irradiation. At the irradiated areas the layer has an absorption according to the curve 21 in FIG. 5. The procedure further to be carried out is then equal to that carried out in the second embodiment. Thus, a negative picture 15 is obtained.

What is claimed is:

1. A method of manufacturing a semiconductor device comprising the steps of:
   (a) applying a base layer of a photosensitive lacquer to a surface of a semiconductor substrate;
   (b) applying to said base layer a top layer of a photosensitive lacquer, said top layer being discolorable by light radiation and consisting essentially of a solution of polystyrene in xylene containing as a light radiation discolorable composition a mixture of a first constituent selected from the group consisting of tetrabromomethane and a halogen-containing triazine derivative and a second constituent, said second constituent being an imine of the formula

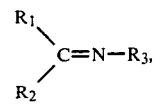

where $R_1$ is a parasubstituted aminophenyl, $R_2$ is hydrogen, alkyl or substituted phenyl and $R_3$ is hydrogen, alkyl or substituted phenyl, said first constituent being capable, upon exposure to light radiation, of producing a substance which is capable of reacting with said second constituent to produce a compound having a color different from that of said second constituent;
   (c) subjecting said top layer to patterned light radiation thereby discoloring said top layer in a patternwise manner and forming a mask for additional radiation of said base layer; and
   (d) subjecting said base layer to a patterned second radiation patterned by said mask in said top layer.

2. A method as claimed in claim 1, characterized in that the first constituent is tetrabromomethane and in that in the second constituent $R_1$ is paradiethyl aminophenyl, $R_2$ is hydrogen and $R_3$ is paramethylphenyl.

3. A method as claimed in claim 2, characterized in that during the first irradiation non-irradiated parts of the top layer are made insensitive to radiation by a thermal treatment, during which tetrabromomethane is baked out of the top layer.

4. A method as claimed in claim 1 characterized in that the first patterned irradiation is carried out with radiation having a wavelength between 300 and 450 nm.

5. A method as claimed in claim 4, characterized in that the second irradiation is carried out with radiation having a wavelength between 300 and 400 nm.

6. A method as claimed in claim 4, characterized in that the second irradiation is carried out with radiation having a wavelength between 400 and 500 nm.

7. A method as claimed in claim 6, characterized in that the base layer consists of a photolacquer containing a novolak, to which a base is added.

* * * * *